United States Patent [19]

Picard et al.

[11] Patent Number: 4,945,258

[45] Date of Patent: Jul. 31, 1990

[54] MONOLITHIC GAAS HIGH SPEED SWITCH DRIVER

[75] Inventors: Gary A. Picard, Langhorne, Pa.; Hayagriva V. Rao, Fairfield, Conn.

[73] Assignee: Grumman Aerospace Corporation, Long Island, N.Y.

[21] Appl. No.: 281,394

[22] Filed: Dec. 8, 1988

[51] Int. Cl.[5] .................. H03K 3/01; H03K 19/20; H03K 19/092; H03L 5/00

[52] U.S. Cl. .................... 307/270; 307/475; 307/443; 307/448; 307/455; 307/456; 307/468; 307/264

[58] Field of Search .............. 307/270, 475, 443, 448, 307/468, 455, 456, 494, 264

[56] References Cited

U.S. PATENT DOCUMENTS

| | | | |
|---|---|---|---|
| 4,527,078 | 7/1985 | Smith | 307/475 |
| 4,684,831 | 8/1987 | Kruest | 307/475 |
| 4,703,205 | 10/1987 | Heimbigner | 307/475 |
| 4,743,782 | 5/1988 | Nelson et al. | 307/475 |
| 4,831,284 | 5/1989 | Anderson et al. | 307/475 |

FOREIGN PATENT DOCUMENTS 0072822  4/1984  Japan ................ 307/475

Primary Examiner—Stanley D. Miller
Assistant Examiner—Trong Quang Phan
Attorney, Agent, or Firm—Bacon & Thomas

[57] ABSTRACT

A high-speed swtich driver provides a precise output voltage swing for microwave switches. A first embodiment is for use with TTL circuits, and includes alternating high-gain voltage level shift and differential amplifier stages. A second embodiment also includes alternating voltage level shift and differential amplifier stages, but further has the flexibility to be used with a variety of logic circuits, including TTL, ECL, differential ECL, CMOS any circuit requiring user-defined input levels. Both embodiments provide complementary outputs at voltage levels that may be set by the user.

6 Claims, 3 Drawing Sheets

MONOLITHIC GAAS HIGH SPEED SWITCH DRIVER

BACKGROUND OF THE INVENTION

1. Field of the Invention

The present invention relates generally to integrated circuit switch drivers, and, more particularly to a high-speed microwave switch driver that is useful at TTL, ECL and user-defined logic levels.

2. Description of the Related Art

Microwave switches are available in large quantities in the marketplace. These switches take various forms, but all require a driver in order to use them. The driver must be able to deliver a precise output voltage swing in order to turn the switch on or off. Most drivers on the market today are made in hybrid form, and are generally slow. Furthermore, no switch driver on the market is known to offer the flexibility of choosing output levels, a large range of power supplies, or a variety of input levels.

SUMMARY OF THE INVENTION

The present invention has been designed to remedy the deficiencies of the prior art. The proposed circuit is monolithic, and uses high-speed GaAs technology for the fastest possible switching times. In one embodiment of the invention, the user may define input levels (e.g., TTL, ECL or other) so that the driver may be used with various logic designs.

In the two disclosed embodiments, an alternating series of voltage level shift stages and differential amplifier stages are utilized to define the output levels. The first embodiment is designed for use with TTL circuits, and includes comparison in the differential amplifier stages of an input signal and an internally generated reference signal. The second disclosed embodiment is a programmable configuration that replaces the internally generated reference with an externally accessible reference input. The user of this circuit may define levels, including ECL, differential ECL, or other user defined levels, and may also use any negative power supply desired below a certain limit with the addition of an external resistor. Because all transistors in the circuit are preferably GaAs, the circuits are operable over a large temperature range.

DETAILED DESCRIPTION OF THE PREFERRED EMBODIMENT

Figure 1:
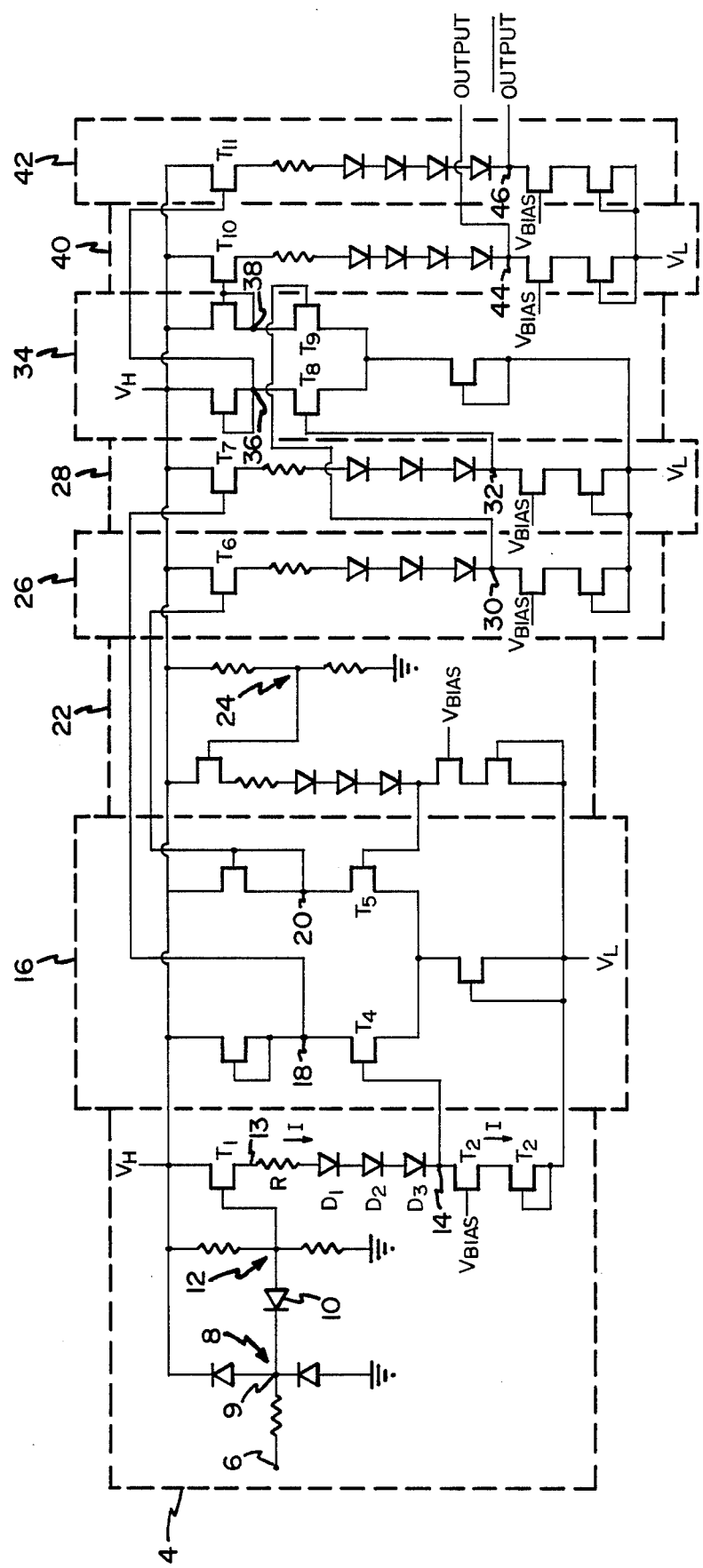
FIG. 1 shows a first embodiment of the present circuit designed for use at TTL logic levels.

FIG. 1 shows in preferred form an embodiment of the present switch driver that operates at standard TTL input levels. Input stage 4, as shown in FIG. 1, performs a threshold detection of the input signal at node 6. After passing through protective diode stage 8, the input signal appears at the cathode of diode 10. If the voltage level of this signal is greater than the intermediate voltage generated by voltage divider 12 minus a diode drop, diode 10 will not conduct and the voltage generated by voltage divider 12 will appear on the gate of transistor $T_1$, which is preferably a metal semi-conductor field-effect transistor (MESFET). If the voltage level of the input signal is less than the intermediate voltage generated by voltage divider 12 minus a diode drop, diode 10 will conduct, causing the gate of $T_1$ to be clamped at an intermediate voltage level equal to a diode drop above the voltage at node 9 (i.e., the cathode of diode 10). The circuit can thus distinguish between low and high logic levels.

Transistor $T_{12}$, which is preferably a depletion-mode MESFET, has its gate tied to its source ($V_{GS}=0$). Since it is a depletion-mode MESFET, $T_{12}$ conducts a constant current. If transistors $T_2$ and $T_1$ are chosen to be the same size as $T_{12}$, and since the same current must flow through all three FETs, the proper selection of resistor R, diodes $D_1$, $D_2$ and $D_3$, and $V_{BIAS}$ causes node 13 to approximate the voltage at the gate of $T_1$ (i.e., $V_{GS}=0$ for $T_1$). Therefore, the voltage at node 14 approximately equals the voltage on the gate of $T_1$ minus three diode drops and the IR drop across R, where I is the current set by $T_{12}$. In this manner, node 14 tracks the gate voltage of $T_1$, and its voltage level is approximately equal to the voltage on the gate of $T_1$ shifted down by a constant amount.

The voltage on node 14, therefore, represents the output of input stage 4. This output appears at the gate of MESFET $T_4$ of differential amplifier stage 16. The gate voltage of $T_4$ is compared with the gate voltage of MESFET $T_5$ in differential amplifier stage 16 to derive output voltages at nodes 18 and 20. The gate voltage of $T_5$ is a reference voltage level shifted in a similar manner to the input signal as described above, and is derived from reference input stage 22, which determines the on/off state for the switch driven by the present driver.

The outputs of differential amplifier stage 16 appear at the gates of MESFETs $T_6$ and $T_7$, which are the controlling MESFETs for two voltage level shift stages of the type already seen in input stage 4 and in reference input stage 22. The outputs of voltage level shift stages 26 and 28 appear at nodes 30 and 32. These output voltage levels are compared in differential amplifier stage 34 at the gates of MESFETs $T_8$ and $T_9$.

The outputs of differential amplifier stage 34 appear at nodes 36 and 38, and are presented to the gates of MESFETs $T_{10}$ and $T_{11}$, respectively. $T_{10}$ and $T_{11}$ are the controlling MESFETs of final voltage level shift stages 40 and 42, which are similar to those voltage level shift stages already seen, with the addition of a fourth diode in each stage. The outputs of voltage level shift stages 40 and 42 appear at nodes 44 and 46 as complementary outputs. They determine the on or off state of a subsequent switch (not shown).

Figure 2:
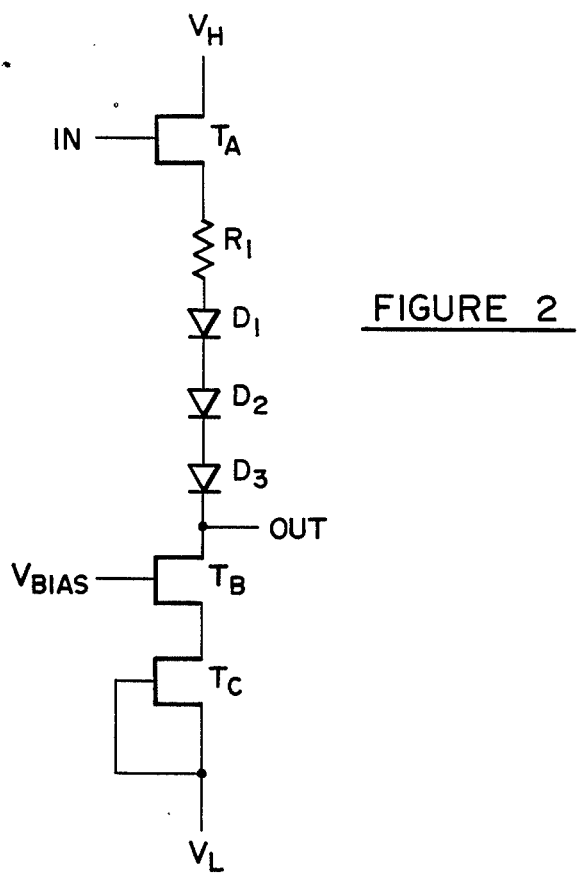
FIG. 2 shows a representative voltage level shift stage.

The operation of any one of the voltage level shift stages mentioned above is conventional in nature. A representative voltage level shift stage is illustrated in FIG. 2. The bias voltage $V_{BIAS}$ of MESFET $T_B$ is set at a level approximately two volts above $V_L$. Since MESFETs $T_A$, $T_B$, and $T_C$ are all the same size, as mentioned above, and since they must conduct the same current, the source of transistor $T_B$ is equal to $V_{BIAS}$ ($V_{GS}$ of $T_B$ is 0 as for $T_C$). MESFET $T_C$ will thus be saturated, maintaining a constant current. The source of $T_A$ likewise tends to follow the input signal $V_{IN}$. $V_{IN}$ is thus level shifted by the voltage drops across the three diodes and the resistor as stated above, so that the level shift is constant within easily determinable limits of $V_{IN}$.

Figure 3:
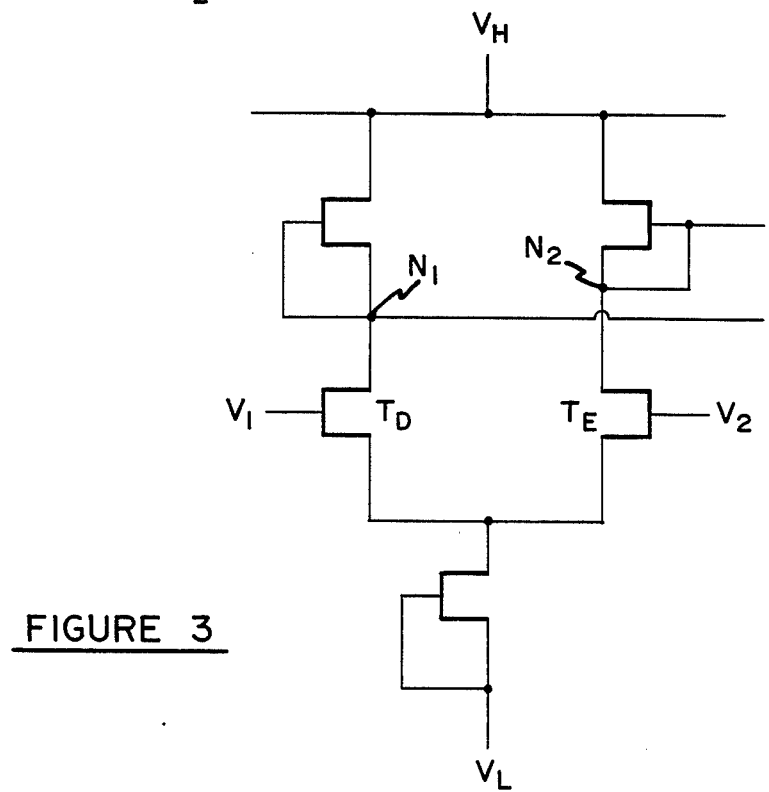
FIG. 3 shows a representative differential amplifier stage.

Differential amplifiers 16 and 34 also operate in a conventional manner. A representative differential amplifier is illustrated in FIG. 3. The voltages at output nodes $N_1$ and $N_2$ are determined by the difference in gate voltages $V_1$ and $V_2$ of $T_D$ and $T_E$.

Figure 4:
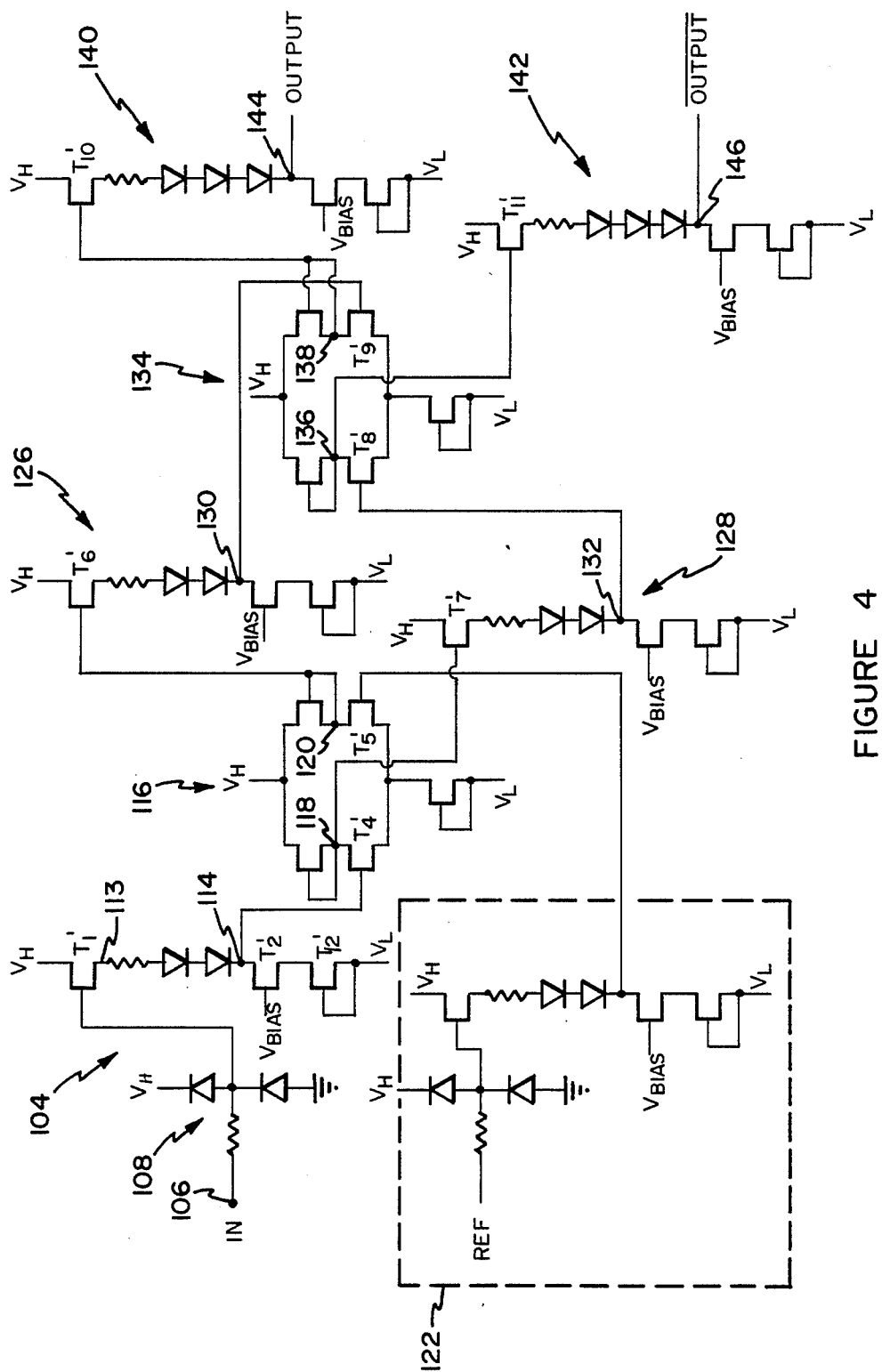
FIG. 4 shows a second embodiment of the present invention for use with user-defined input levels.

FIG. 4 shows a modified embodiment of the FIG. 1 circuit, wherein most like elements are denoted by reference numerals derived by adding 122 to the reference numerals of like elements in FIG. 1 and by adding a prime to like transistor reference symbols in FIG. 1. The major distinguishing feature of the FIG. 4 circuit is reference input 122, which replaces internally generated reference input 22 of the FIG. 1 circuit. By utilizing a separately accessible reference input, the circuit can be used for a large range of power supplies, enabling the operator to choose ECL, differential ECL, CMOS, or any user-defined input levels, thus making the circuit programmable. The differential nature of the circuit makes programmability possible because it allows a wide tolerance to input levels, and also provides ease of manufacturing.

The various transistors utilized in the circuits described above are preferably MESFETs for their speed, simplicity of manufacture, and substantial temperature independence. The MESFETs, however, are merely preferred, and other appropriate elements, including MOSFETs, JFETs, or bipolar junction transistors, could be substituted with minor modifications to the circuits.

By way of example, the reference input for an ECL circuit may be set to −1.3 volts, while an appropriate TTL reference input would be 1.4 volts. The reference input voltage level may be set at any level by the user, but is preferably set at approximately the middle of the input swing for the particular logic family used.

Various modifications of the invention discussed above will become apparent to those skilled in the art. All such variation that basically rely on the teachings through which the invention has advanced the art are properly considered within the spirit and scope of the invention.

We claim:

1. A high-speed switch driver circuit, comprising:
    a reference input stage arranged to receive and process a predetermined input signal and to output a reference signal;
    an input stage arranged to receive and process an input signal and to produce an intermediate voltage level, including a first voltage level shift stage having means arranged to output a first voltage level shift signal, wherein the first voltage level shift signal voltage is less than the intermediate voltage;
    a first differential amplifier stage, including means arranged to receive and process the first voltage level shift signal and the reference signal, and to output first and second first differential amplifier signals, said first of said first differential amplifier signals having a voltage level greater than or equal to zero and proportional to the difference between the first voltage level shift signal voltage and the reference signal voltage, and said second of said first differential amplifier signals having a voltage level less than or equal to zero and proportional to the difference between the first voltage level shift signal voltage and the reference signal voltage;
    second and third voltage level shift stages, each including means arranged to receive and process a respective one of the first differential amplifier stage output signals and to output a shifted differential amplifier signal having a voltage level shifted from the respective first differential amplifier signal;
    a second differential amplifier stage, including means arranged to receive and process said shifted differential amplifier signals and to output two second differential amplifier signals, one said second differential amplifier signal having a voltage level greater than or equal to zero and proportional to the difference between the first shifted differential amplifier signal voltage and the second shifted differential amplifier signal voltage, and the other of said second differential amplifier signals having a voltage level less than or equal to zero and proportional to the difference between the second shifted differential amplifier signal voltage and the first shifted differential amplifier signal voltage; and
    fourth and fifth voltage level shift stages, including means arranged to receive and process a respective one of the second differential amplifier stage signals and to output two switch state-determining voltage level signals, wherein said switch state-determining voltage level signals determine the on/off characteristics of a driven switch.

2. A high-speed switch driver circuit as claimed in claim 1, wherein said switch driver circuit operates at TTL voltage levels.

3. A high-speed switch driver circuit as claimed in claim 1, wherein the switch driver circuit includes at least one semiconductor device comprising gallium arsenide.

4. A high-speed switch driver circuit as claimed in claim 1, wherein said predetermined input signal is generated internally by the circuit.

5. A high-speed switch driver circuit as claimed in claim 1, wherein said predetermined input signal is programmed at an external input to the circuit.

6. A high-speed switch driver circuit as claimed in claim 1, wherein the switch driver circuit includes at least one field-effect transistor.

* * * * *